United States Patent [19]

Takeshima et al.

[11] Patent Number: 4,962,484
[45] Date of Patent: Oct. 9, 1990

[54] NON-VOLATILE MEMORY DEVICE

[75] Inventors: Masahiko Takeshima; Naoki Mitsuishi, both of Tokyo, Japan

[73] Assignee: Hitachi, Ltd., Tokyo, Japan

[21] Appl. No.: 148,078

[22] Filed: Jan. 25, 1988

[51] Int. Cl.⁵ .................. G11C 13/00; G11C 11/40
[52] U.S. Cl. ................................. 365/226; 365/227
[58] Field of Search ................. 365/201, 226, 227

[56] References Cited

U.S. PATENT DOCUMENTS 4,777,626 10/1989 Matsushita ........................ 365/26
4,814,647 3/1989 Tran ................................... 365/26

OTHER PUBLICATIONS

"On–Chip EEPROM Makes μC Easy to Reprogram" from Electronic Design, Mar. 3, 1983, pp. 123–128.

*Primary Examiner*—Terrell W. Fears
*Attorney, Agent, or Firm*—Fay, Sharpe, Beall, Fagan, Minnich & McKee

[57] ABSTRACT

Non-volatile memory cells for security and a power supply voltage detection means are disposed in a non-volatile memory device. Information to be secured is stored in the security non-volatile memory cell and the output of the information to be secured which is stored in the non-volatile memory cell is inhibited by a signal from the power supply voltage detection circuit when a power supply voltage other than the rated value is applied. Accordingly, even when a power supply voltage other than the rated value is applied, the stored information of the security non-volatile memory cell can be used correctly, so that the object of improving security in the non-volatile memory device having the security function can be accomplished.

11 Claims, 5 Drawing Sheets

NON-VOLATILE MEMORY DEVICE

BACKGROUND OF THE INVENTION

This invention relates to a semiconductor memory technique and further to a technique which is particularly effective for securing data stored in a non-volatile memory device. For instance, the present invention relates to a technique which will be effective when utilized for EPROM (Erasable and Programmable Read-Only Memory).

Securing data written into a non-volatile memory cell such as EPROM incorporated in a chip is necessary to prevent unauthorized acquisition of data by a third party.

A prior art method for protecting the data stored in a non-volatile memory device uses a security register which is comprised of a non-volatile memory cell distinct from a memory cell group (memory cell array) within the device. The security register inhibits access to the memory cell group from outside devices depending on the status of a specific bit or bits of this register (see "Electronic Design", published on Mar. 3, 1983, pp. 123–128).

The inventors of the present invention have observed security function failures in devices which utilize non-volatile memory for information storage by using a threshold voltage. The security transistor does not operate correctly when a power supply voltage higher than a rated value is applied thereto.

This failure will be described in further detail with reference to FIG. 7 of the accompanying drawings. FIG. 7 shows the sectional structure of a FAMOS (Floating gate Avalanche injection MOS) transistor as an example of an electrically writable non-volatile memory cell constituting EPROM. In this drawing, reference numeral 110 represents a floating gate, 111 is a control gate electrode, 112 is a source electrode and 113 is a drain electrode.

The floating gate 110 and the control gate 111 are composed of polycrystalline silicon, for example, and the source 112 and the drain 113 are an N-type region formed on a P-type silicon substrate 100. The floating gate 110, source 112 and drain 113 are separated from the substrate 100 by insulating films. The floating gate 110 and the control gate 111 are separated from each other by an insulating film, too. The floating gate 110 is completely encompassed by the insulating film.

The table below illustrates voltages applied to the electrodes in each operation mode of the memory cell. The applied voltage conditions result in either a read or write of a logic "0" or "1" to the memory cell.

TABLE 1

|  | substrate | source 112 | control gate 111 | drain 113 |
|---|---|---|---|---|
| write of "0" | 0 | 0 | $V_{pp}$ | $V_{pp}$ |
| write of "1" | 0 | 0 | $V_{cc}$ | $V_{pp}$ |
| read | 0 | 0 | $V_{cc}$ | $D_{out}$ |

The "0" write operation occurs when the substrate 100 and the source 112 are grounded and a high voltage $V_{pp}$ (e.g. 12.5 V) is applied to the drain 113 and the control gate 111. This creates a potential gradient between the source 112 and the drain 113. This electric field accelerates some electrons to an energy level sufficient to overcome the energy barrier of the gate insulating film. These freed electrons are attracted by the potential of the control gate 111 and migrate into the floating gate 110. These electrons are encompassed by the energy barrier of the insulating film and stably exist inside the floating gate 110.

In the "1" write operation, the substrate 100 and the source 112 are grounded and the high voltage $V_{pp}$ and a power supply voltage $V_{cc}$ (e.g. 5 V) are applied to the drain 113 and to the control gate 111, respectively. Since the control gate 111 potential is low, the electron does not jump into the floating gate 110, and the gate state remains the same as before the write operation.

The state where the electron is stored in the floating gate 110 will be referred to as "0" and the state where it is not stored will be referred to as "1", though this definition is not particularly limitative. The stored information in the EPROM is erased by radiating ultraviolet rays. This radiation causes the electrons inside the floating gate 110 to acquire sufficient energy to jump from the control gate so that the memory cell enters the "1" state.

The read operation occurs when the substrate 100 and the source 112 are grounded and the power supply voltage $V_{cc}$ is applied to the control gate 111. The data is outputted to the drain 113 under this voltage condition.

FIG. 8 is a fundamental characteristic diagram of the memory cell. Symbol $V_G$ represents the input voltage of the control gate 111 while $I_{SD}$ represents the source-drain current.

In the memory cell under the "1" state, $I_{SD}$ starts flowing when $V_G$ is about 1 V while in the memory cell under the "0" state, $I_{SD}$ does not start flowing unless $V_G$ is from about 7 to about 10 V. This difference is caused by the negative voltage component resulting from the electrons stored in the floating gate 110. If the Voltage $V_G$ applied to the control gate 111 is 5 V in the read operation then the memory cell under the "1" (unwritten) state is turned ON while the memory cell under the "0" (write) state is OFF. This operation provides access to the memory information. However, if the voltage applied to control gate 111 is sufficiently high (e.g. 10 V), then the memory cell can be turned ON irrespective of its "1" or "0" state.

FIG. 9 shows an example of non-volatile memory devices used for securing data which utilize the non-volatile memory cells shown in FIG. 7. The circuit shown in FIG. 9 is one that was analyzed by the present inventors before completing the present invention.

In FIG. 9, reference numeral 51 represents a non-volatile memory cell array disposed in a matrix, 52 is an input/output (I/0) circuit, 53 is an external input/output (I/0) terminal, 54 is switch N-channel MOS transistor, 11 is a security non-volatile memory cell (transistor), 12 is a resistor and 13 is an inverter.

When security for the non-volatile memory cell array 51 is necessary, the writer operation described above occurs and the security transistor 11 transitions to the "0" (write) state. This causes the input of the inverter 13 to go to the high (H) level while the gate input of the switch transistor 54 goes to the low (L) level turning off switch (54). Accordingly, external access to the memory array is inhibited.

When the security function is not needed, the security transistor 11 is at the "1" (unwritten) state. The input of the inverter 13 is "L" while the gate input of the switch transistor 54 is "H" turning on the switch 54. This permits data access to memory cell array 51 through the external I/0 terminal 53.

If the power supply voltage is above the maximum rated value in the security system shown in FIG. 9, the security transistor 11 is turned ON, even when transistor 11 is under the write state. Thus, the data is available and no longer secure. This problem was discovered by the inventors before completion of the present invention.

SUMMARY OF THE INVENTION

The present invention prevents an overriding of the security function in a non-volatile memory device when an unrated power supply voltage is applied thereto. This and other object and novel features of the present invention will become more apparent from the following description when taken in connection with the accompanying drawings.

Among the inventions disclosed herein, the following will illustrate a typical example.

The present invention is comprised of a security non-volatile memory cell with a power supply voltage detection circuit. The security status is stored in the security non-volatile memory cell. When a power supply voltage greater than the rated voltage is applied, the output of the security status stored in the security non-volatile memory cell is inhibited by the power supply voltage detection circuit. In other embodiments of the invention, the application of a power supply voltage to the control terminal of the security non-volatile memory cell which is greater than the rated voltage is inhibited.

The means described above protects the stored security status data in the security non-volatile memory cell and preserves the security function of the non-volatile memory device.

DESCRIPTION OF THE PREFERRED EMBODIMENT

Figure 1:
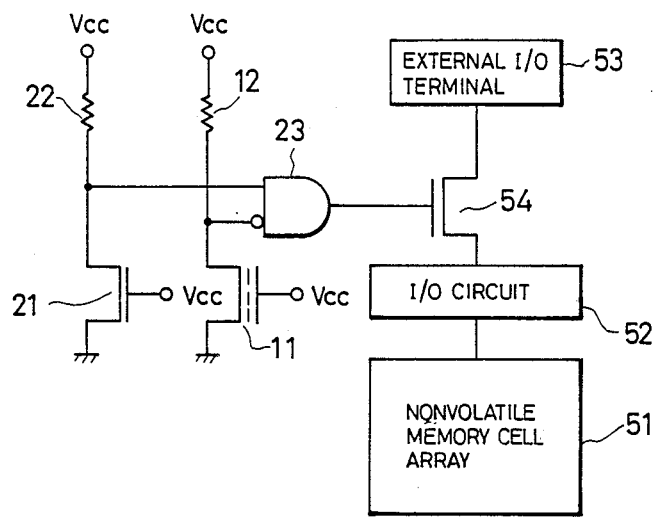
FIG. 1 is a block circuit diagram showing the first embodiment of the present invention when applied to EPROM.

FIG. 1 shows one embodiment of the present invention when applied to EPROM.

In FIG. 1, reference numeral 21 represents an N-channel MOS transistor for detecting a power supply voltage and reference numeral 23 represents a logic gate consisting of a 2-input AND circuit. A power source voltage $V_{cc}$ is applied to the gate terminal of the transistor 21. The transistor 21 for detecting the power supply voltage is turned OFF when the power supply voltage $V_{cc}$ is below a maximum rated value. The transistor 21 changes state when a voltage higher than the maximum rated voltage but lower than the write voltage of the security transistor is applied to the gate.

Figure 2:
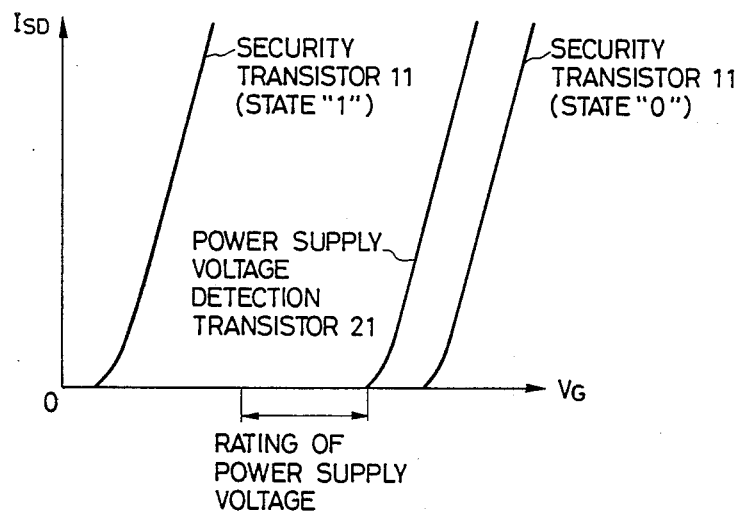
FIG. 2 is a diagram showing the characteristics of power supply voltage detection means in the first embodiment.

As shown in FIG. 2, the threshold voltage of the power supply voltage detection transistor 21 is set to be higher than the maximum rated value of the power supply voltage but lower than the minimum value of the threshold voltage of the security transistor 11 under the write state. The power supply voltage $V_{cc}$ is also applied to the control gate terminal of the security transistor 11.

If the power supply voltage $V_{cc}$ satisfies the rated value in this embodiment, the power supply voltage detection transistor 21 is always OFF. Hence, the potential of the junction node between the transistor 21 and the resistor 22 is at the $V_{cc}$ level and one of the inputs of the logic gate 23 is "H". If the security transistor has not been written in this state, the transistor 11 is turned ON and the potential at the junction node between the transistor 11 and the resistor 12 is the ground potential (at the low level). As a result, the output of the logic gate 23 is "H" and the switch transistor 54 is turned ON. If the security transistor 11 has been written (the security state), the transistor 11 is turned OFF and both inputs to the logic gate 23 are "H". This drops the gate input of the switch transistor 54 to "L" which turns off the switch. Data input/output between the non-volatile memory cell array 51 and the external input/output terminal 53 is thereby inhibited.

As the power supply voltage $V_{cc}$ is raised above the maximum rated value the power supply voltage detection transistor 21 is turned ON before the security transistor 11 under the write state is. Thus, one of the inputs of the logic gate 23 is always "L" causing the output of the logic gate 23 to stay "L" and the switch transistor 54 remains OFF. Accordingly, raising the power supply voltage $V_{cc}$ above the rated voltage does not enable the read operation of the stored data irrespective of the state of the security transistor 11, and the security function of the device is preserved.

Figure 3:
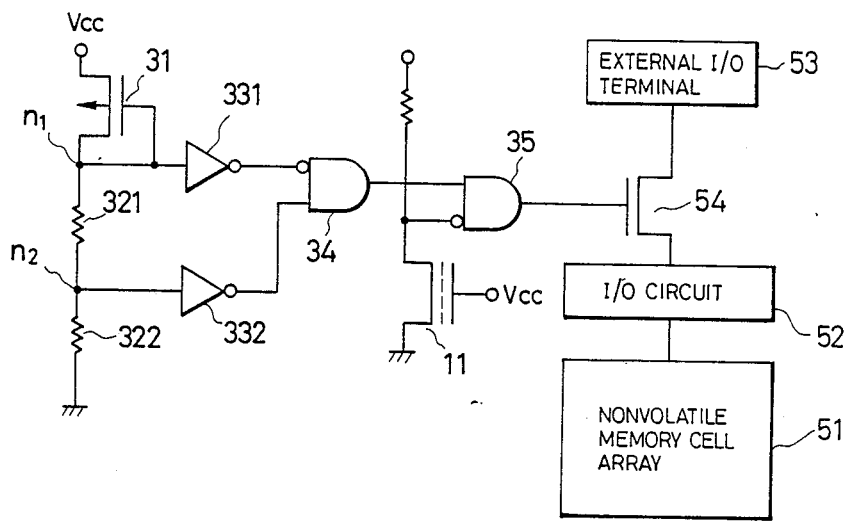
FIG. 3 is a block circuit diagram showing the second embodiment of the invention applied to EPROM.

FIG. 3 is a block circuit diagram showing another structure of EPROM in accordance with the present invention.

In FIG. 3, reference numeral 31 represents a load MOS transistor and reference numerals 321 and 322 represent resistors. The load MOS transistor 31 is of a P-channel type and its drain and gate are connected so that the transistor is normally ON. The transistor 31 and the resistors 321, 322 are connected in series between $V_{cc}$ and the ground to form a resistor shunt circuit. Reference numerals 331 and 332 represent inverters for inputting the shunt voltages $V_{n1}$ and $V_{n2}$, respectively, and reference numerals 34 and 35 represent logic AND gates which receive the output signals of the inverters.

The inverters 331, 332 detect the rated minimum and maximum values of the power supply voltage $V_{cc}$, respectively. The constant of each device is set so that the output signal of the logic gate 34 is "H" only when the power supply voltage $V_{cc}$ satisfies the rated value.

Figure 4:
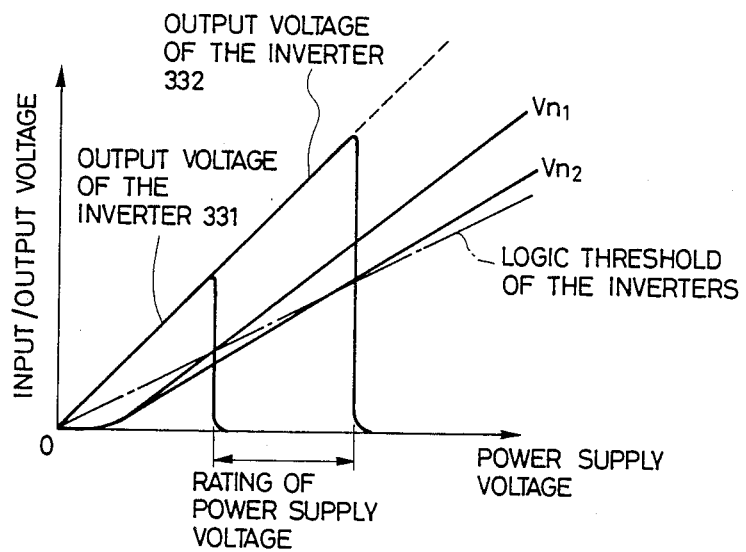
FIG. 4 is a diagram showing the characteristics of the power supply voltage detection circuit in the second embodiment.

FIG. 4 shows the characteristics of the inverters 331, 332 described above.

The diagram shows the characteristics of the inverters 331,332 responding to changes of the power supply voltage.

The logic threshold voltage of each inverter 331,332 changes with variations of the power supply voltage $V_{cc}$. A "H" is outputted when the input voltage is below the logic threshold voltage of the inverter. A "L" is outputted when the input voltage is above the logic threshold voltage. The input voltage of the inverter 331 is the difference obtained by subtracting the voltage drop by the load transistor 31 from the power supply voltage $V_{cc}$ while the input voltage of the inverter 332 is the difference obtained by further subtracting the voltage drop by the resistor 321. The voltage generated by the resistor shunt circuit increases with the rise of the power supply voltage and the inverter input voltage. The input voltage of the inverter 331 first reaches the logic threshold voltage and the output of this inverter 331 changes from "H" to "L". When the power supply voltage is raised further, the input voltage of the inverter 332 reaches the logic threshold value and the output of the inverter 332 changes from "H" to "L".

The input voltages of the inverters 331, 332 can be set by the characteristics of the load transistor 31 and the resistance values of the resistors 321, 322. In this embodiment the power supply voltages (logic threshold values) of the inverters 331, 332 conform to the rated minimum and maximum power supply values, respectively. When the power supply voltage $V_{cc}$ is within the rated range, the outputs of the inverters 331, 332 are "L" and "H", respectively. A "H" level signal is outputted from the logic gate 34 to one of the input terminals of the logic gate 35. Consequently, the input inhibition transistor 54 is turned OFF when the security transistor 11 is under the write state and the transistor 54 is turned ON when it is under the unwritten state "1". The status of the security function (inhibition of input/output) is determined by the state of the security transistor 11 as it was in the foregoing embodiment.

When the power supply voltage $V_{cc}$ is below the rated minimum value, the outputs of the inverters 331, 332 are at the "H" level and when the power supply voltage is above the rated maximum value, the outputs of the inverters 331, 332 are at the "L" level. In either case, the output of the logic gate 34 is "L" causing the output of the logic gate 35 to "L". This turns OFF the transistor 54 irrespective of the state of the security transistor 11. In this manner the security function is preserved since applying an unrated voltage disable access to the memory array.

Figure 5:
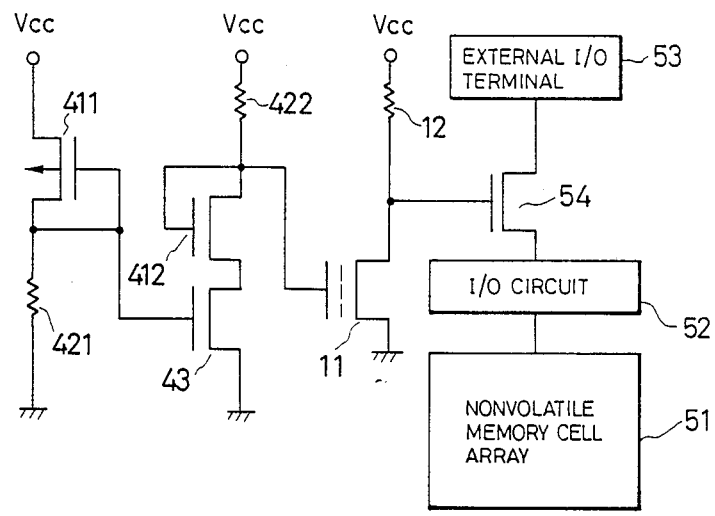
FIG. 5 is a block circuit diagram showing the third embodiment of the inventions applied to EPROM.

FIG. 5 shows the third embodiment of EPROM in accordance with the present invention.

In FIG. 5, reference voltage 411 represents a P-channel load MOS transistor, 412 is an N-channel load MOS transistor, 421 and 422 are resistors and 43 is an ON/OFF transistor.

Though MOS transistors 411 and 412 have mutually different conductivity types, the gate and drain of each transistor are connected so that the transistor functions as a resistor. The transistor 411 is also connected in series with the resistor 421 to form a resistor shunt circuit. The load MOS transistor 412 and the resistor 422 are connected in series between the drain of the transistor 43 and $V_{cc}$ to form a voltage clamp circuit.

The voltage generated by this voltage clamp circuit is applied to the gate of the security transistor 11 so that the gate voltage does not rise above a predetermined value.

Figure 6:
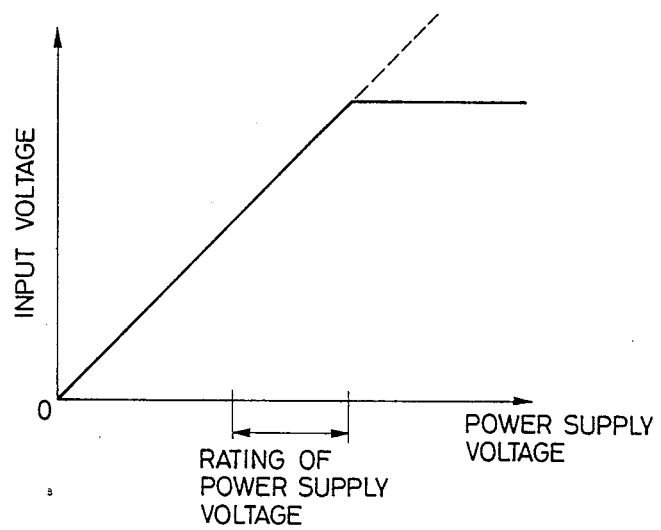
FIG. 6 is a diagram showing the characteristics of the power supply voltage detection circuit in the third embodiment.
Figure 7:
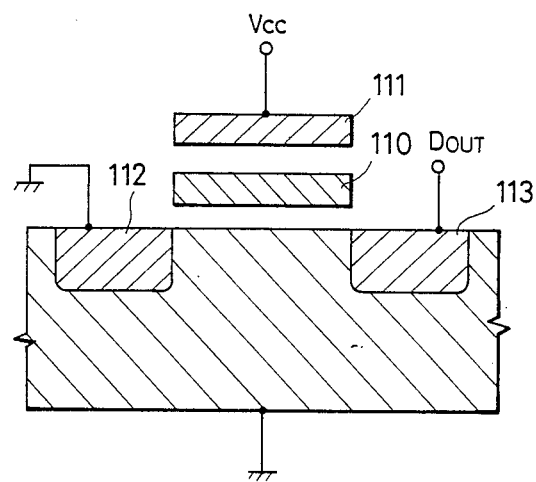
FIG. 7 is a sectional view of a non-volatile memory cell constituting EPROM.
Figure 8:
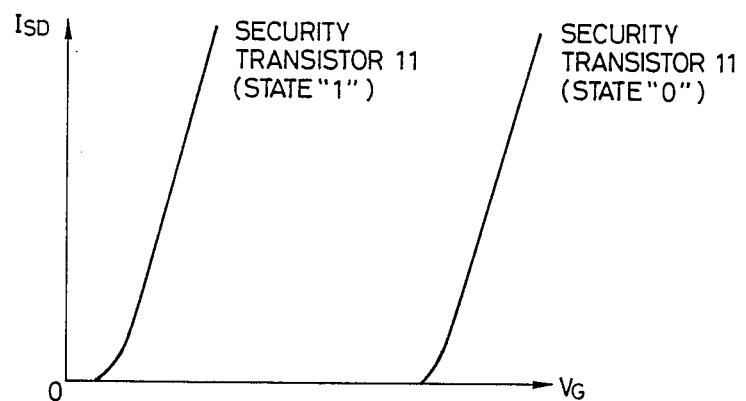
FIG. 8 is a diagram showing the characteristics of the non-volatile memory cell.
Figure 9:
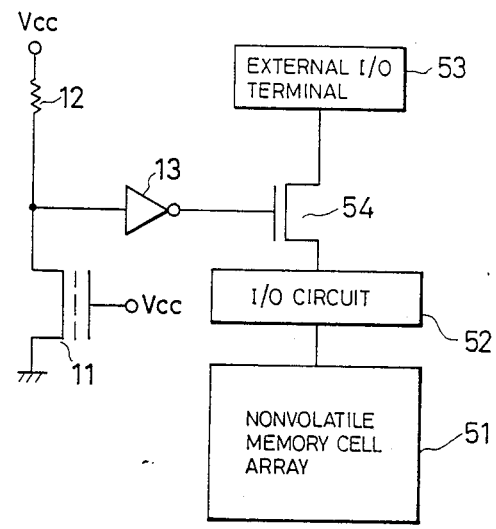
FIG. 9 is a block circuit diagram of a non-volatile memory device having security memory cells proposed by the present inventors prior to the present invention; and, FIG. 10 is a block diagram of a microcomputer with built-in EPROM to which the present invention is applied.

FIG. 6 shows the characteristics of the output voltage of the voltage clamp circuit which is applied to the gate of the security transistor 11.

The gate input voltage of the ON/OFF transistor 43 is the difference obtained by subtracting the voltage drop by the load transistor 411 from the power supply voltage $V_{cc}$. When the power supply voltage $V_{cc}$ is sufficiently low, the ON/OFF transistor 43 is OFF and no current flows through the resistor 422. This means the voltage drop across resistor 422 is zero and the gate input voltage of the security transistor 11 is equal to the power supply voltage $V_{cc}$. As the power source voltage $V_{cc}$ rises, the gate input voltage of the ON/OFF transistor 43 rises in proportion thereto and when this voltage reaches the threshold voltage of the ON/OFF transistor 43, the ON/OFF transistor 43 is turned ON and the current flows through resistor 422. The gate input voltage of the security transistor 11 at this time is determined by the load transistor 412 and by the voltage held by the ON/OFF transistor 43. This is a predetermined value which does not depend on the power supply voltage. This predetermined value can be set arbitrarily by the characteristics of the load transistor 412 and ON/OFF transistor 43. In this embodiment, it is set to be below the threshold voltage $V_{thH}$ of the security transistor 11 under the write state but to be above the threshold voltage $V_{thL}$ in its unwritten state.

When the power supply voltage $V_{cc}$ is raised above the rated value, the gate input voltage of the security transistor 11 does not exceed the predetermined value and the transistor does not conduct irrespective of its write state. The manner described above, prevents an override of the security function by raising the power supply voltage above the rated value.

As described above, this embodiment utilizes a security non-volatile memory cell and a power supply voltage detection circuit and stores the security status data in the security non-volatile memory cell. This embodiment inhibits the output of the security status data of the security non-volatile memory cell by a signal from the power supply voltage detection circuit or by inhibiting application of power supply voltages other than the rated values to the control terminal of the security non-volatile memory cell. Accordingly, even when power supply voltages other than the rated values are applied, the stored data of the security non-volatile memory cell is preserved and the security cell functions correctly.

Figure 10:
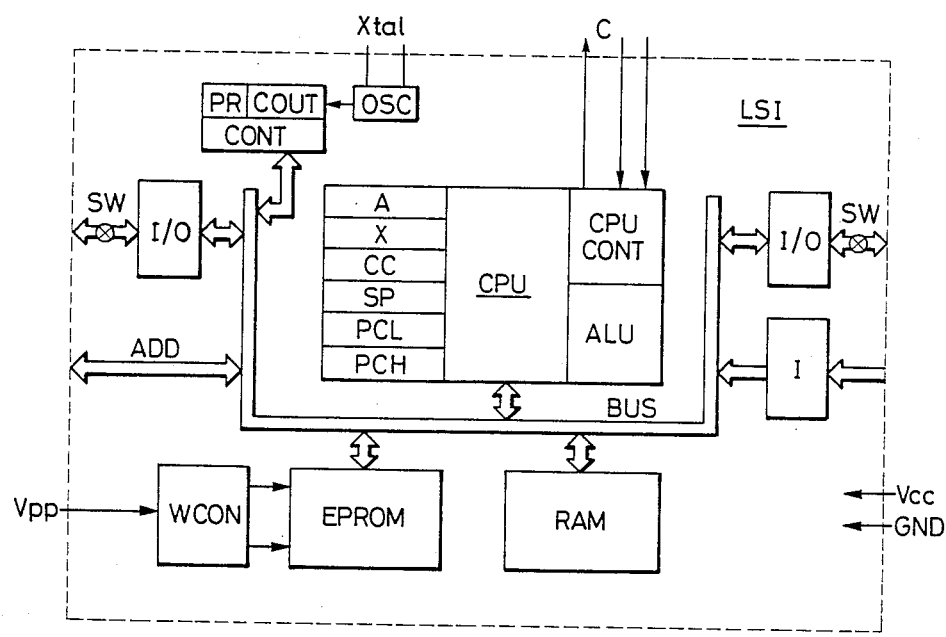

FIG. 10 shows a block diagram of a 1-chip microcomputer to which the present invention is applied.

In the drawings, the circuit portion encompassed by dash lines represents an integrated circuit LSI and each circuit block constitutes a typical function within a 1-chip microcomputer. It is formed on one semiconductor substrate such as silicon by a known fabrication technique of semiconductor integrated circuits.

Symbol CPU represents the microprocessor and its principal constituent blocks are shown as examples. Symbol A represents an accumulator, X is an index register, CC is a condition code register, SP is a stack pointer, PCH and PCL are program counters, CPU-CONT is a CPU controller and ALU is an arithmetic and logic unit.

Since the construction of such a microprocessor CPU is known from, for example, "Basis of Microcomputers", Koji Yada et al., Apr. 10, 1978, published by Ohm-Sha, its detailed description will be omitted.

Symbol I/0 represents an input/output port which incorporates therein a data transfer direction register. Symbol I represents an input/only port.

A switch circuit SW for inhibiting the input is disposed on a signal line connected to I/0. This switch circuit includes an input/output inhibition transistor 54 such as the transistor shown in FIG. 1. The input/output inhibition switch circuit SW is controlled by the circuits of the present invention such as those shown in FIGS. 1, 3 and 5. It is also possible to dispose an input/output inhibition circuit having the same function as that of the switch circuit SW described above inside the input/output port I/0. Both embodiments operate in accordance with the present invention. These circuits control the operation of the input/output I/0.

Symbol OSC represents an oscillation circuit which generates a high precision reference frequency signal. The signal is derived from a quartz oscillator Xtal, though not particularly limitative and is connected from outside. Clock pulses necessary for the microprocessor are generated by this reference frequency signal. This reference frequency signal is used as a reference time pulse for the timer, too. The timer consists of a counter COUNT, a prescaler PR and a controller CONT.

Symbol RAM represents a random access memory, which is used as a memory circuit of temporary data. Symbol EPROM represents an electrically programmable read-only memory, into which programs for various information processing are written.

Each circuit block described above is connected to one another by a bus BUS with the microprocessor CPU being the center. This bus BUS includes a data bus and an address bus. Among the bus BUS, the address bus ADD is connected to the external terminal for the write operation to EPROM, and so forth.

Since the microcomputer of this embodiment uses EPROM, a control circuit WCON for the write operation and the like is connected to the EPROM. Though not particularly limitative, this control circuit WCON distinguishes the voltage levers supplied from the external terminal $V_{pp}$. It supplies control voltages for the read/write operation modes and write high voltage to the EPROM. When a relatively low voltage (5 V), such as an internal power supply voltage $V_{cc}$ or the ground potential of the circuit is supplied from the external terminal the built-in voltage level detection circuit generates a low level identification signal. This low level signal is used for setting the operation mode to read when the EPROM is selected by the CPU, for example. When the high voltage (e.g. 12 V) for writing EPROM is supplied from the external terminal $V_{pp}$, the voltage level detection circuit generates the high level identification signal. This high level signal actuates the data input buffer of the EPROM. For example, the signal generates a logic "0" write high level signal from the high voltage $V_{pp}$ described above and writes the logic "0" into the selected memory cell (the non-volatile memory cell of a stacked gage structure having a control gate and a floating gate). The address signal for the EPROM is directly supplied from the outside.

The integrated circuit LSI of this embodiment is molded as a whole by a plastic package, for example. After such packaging, the erase operation of the built-in EPROM is not possible.

Though the present invention has thus been described definitely with reference to some preferred embodiments there of, it is not particularly limited thereto but can of course be changed or modified in various manners without departing from the scope and spirit thereof. For example, the circuit for detecting the power supply voltage is not particularly limited to the circuits described in the foregoing embodiments but may be those circuits which provide the same function. Each circuit block may be implemented by any circuits which perform the same operation.

It is possible to form the non-volatile memory device and circuit devices performing other functions on the same semiconductor substrate as shown in FIG. 10. In such a case, the data security function may allow access to the input/output of data to and from the circuit devices on the same substrate while input/output of data to and from the outside is inhibited, as shown in FIG. 10.

Though the invention has thus been described with reference to the EPROM device as the background and field of utilization of the present invention, the invention is not particularly limited thereto but can be widely used for other non-volatile memory devices in general such as EEPROMs (Electrically Erasable PROMs).

What is claimed is:

1. A non-volatile semiconductor memory device to be operated by a first voltage between a maximum rated value and a minimum rated value and a second voltage, the non-volatile semiconductor memory device comprising:

a plurality of external terminals comprising first terminals to receive the first voltage and the second voltage, and second terminals;

a plurality of non-volatile memory cells for storing information therein;

power supply voltage detection means, coupled to the first terminals, for generating a detection signal, the detection signal assuming a first detection level when the first voltage received by the first terminals is greater than the maximum rated value, and assuming a second detection level when the first voltage received by the first terminals is equal to or less than the maximum rated value;

security status control means for providing a data signal assuming a first protected level when the information stored in the plurality of non-volatile memory cells is in a protected mode, and assuming a second unprotected level when the information stored in the plurality of non-volatile memory cells is in an unprotected mode;

gate means, coupled to the power supply voltage detection means and to the security status control means, for producing a control signal assuming a first control potential when the detection signal is in the first detection level and also when the detection signal is in the second detection level and the data signal is in the first protected level, and assuming a second control potential when the detection signal is in the second detection level and the data signal is in the second unprotected level; and, coupling means, disposed between the second terminals and the plurality of non-volatile memory cells, for coupling the plurality of non-volatile memory cells to the second terminals when the control signal is in the second control potential and for uncoupling the plurality of non-volatile memory cells from the second terminals when the control signal is in the first control potential.

2. A non-volatile memory device according to claim 1, wherein said non-volatile memory cells each comprises stacked gate transistors whose threshold voltage changes depending on whether or not charge is built up in the control gate.

3. The non-volatile semiconductor memory device according to claim 2, wherein:
the security status control means includes a non-volatile memory cell having a control gate connected to the first voltage for storing and read control data, the read control data being representative of whether the information stored in the plurality of non-volatile memory cells is in a protected mode.

4. A non-volatile semiconductor memory device operable by a first voltage operable between a maximum rated value and a minimum rated value, and a second voltage the non-volatile semiconductor memory device comprising:
a plurality of external terminals including a first terminal for receiving the first voltage, a second terminal for receiving the second voltage, and third terminals;
a plurality of stacked gate type non-volatile memory cells for storing information therein, each stacked gate type non-volatile memory cell including a control gate to store a charge, the charge directly relating t a threshold voltage value necessary to activate each stacked gate type non-volatile memory cell;
a security status control circuit including:
a stacked gate storage MOS transistor operable in a first state when the information stored therein is in a security status and operable in a second state when the information stored therein is in a non-security status, and,
a resistor, coupled to a source-drain path of the stacked gate storage MOS transistor in series between the first terminal and second terminal;
coupling means, coupled between the third terminals and the non-volatile memory cells, for coupling the non-volatile memory cells to the third terminals when the information stored in the stacked gate storage MOS transistor is in the non-security status and for uncoupling the non-volatile memory cells from the third terminals when the information stored in the stacked gate storage MOS transistor is in the security status; and,
a voltage clamp circuit, coupled to the control gate of the stacked gate storage MOS transistor, for applying a clamp circuit voltage to the gate of stacked gate storage MOS transistor, the clamp circuit voltage clamping at a maximum rated value when the first voltage becomes greater than a predefined maximum rated value.

5. A non-volatile memory device comprising a plurality of external input/output terminals wherein data paths external to the non-volatile memory device can be connected;
a non-volatile memory cell storage array means for storing data in a memory cell array;
a connecting means, responsive to a disabling connecting means signal, for connecting at least one of the plurality of external input/output terminals to the non-volatile memory cell storage array means; and,
a disabling means, operatively connected to the connecting means, for disabling the connecting means when the memory cell array is in a protected mode, the disabling means comprising a security transistor and a power supply voltage detection circuit.

6. The non-volatile memory device according to claim 5 wherein the disabling means generates the disabling connecting means signal when a power supply voltage to the memory device, detected by the power supply voltage detection circuit, exceeds a predetermined level.

7. The non-volatile memory device according to claim 5 wherein the disabling means generates the disabling connecting means signal in response to a preselected data value, the preselected data value being held by the security transistor.

8. The non-volatile memory device according to claim 6 wherein the disabling means generates the disabling connecting means signal when the power supply voltage detection circuit detects a power supply voltage to the memory device less than a first predetermined level or greater than a second predetermined level wherein the first predetermined level is less than the second predetermined level.

9. The non-volatile memory device according to claim 7 further comprising:
a voltage clamp circuit means for limiting a voltage to the disabling means, whereby the voltage to the disabling means does not exceed a predetermined value.

10. An integrated microcomputer including a read only memory for storing program data therein, a CPU coupled to the read only memory for executing a program in accordance with the program data stored in the read only memory, the integrated microcomputer being operable in a security status mode and a non-security status mode and further being powered by a first power supply voltage and a second power supply voltage between a maximum rated value and a minimum rated value;
a first external terminal for receiving the first power supply voltage;
a second external terminal for receiving the second power supply voltage;
third external terminals;
power supply voltage detection means, coupled between the first external terminal and the second external terminal, for producing a detection signal, the detection signal having a first detection signal state when the second power supply voltage received by the second external terminal is greater than the maximum rated value, and having a second detection signal state when the second power supply voltage received by the second external terminal is less than or equal to the maximum rated value;
security status control means for providing a data signal having a first protected level when the integrated microcomputer is in the security status mode, and having a second unprotected level when the microcomputer is in the non-security status mode;
gate means, coupled to the power supply detection means and to the security status control means, for generating a control signal having a first potential when the detection signal is in the first detection signal state and when the detection signal state and the first protected level, respectively, and the control signal having a second potential when the detection signal and the data signal are in the second detection signal and the second unprotected level, respectively; and, coupling means, disposed between the third external terminals and the read only memory and responsive to the control signal, for coupling the read only memory to the third external terminals when the control signal is in the second potential, and for uncoupling the read only memory form the third external terminals when the control signal is in the first potential.

11. The integrated microprocessor of claim 10 wherein the security status control means includes a stacked gate type memory element for storing data representing the security status mode and the non-security status mode of the integrated microprocessor.

* * * * *